(12) United States Patent
Zhang

(10) Patent No.: US 10,608,191 B2
(45) Date of Patent: Mar. 31, 2020

(54) OLED DEVICE, GLASS SUBSTRATE AND FABRICATING METHOD THEREOF

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventor: Liang Zhang, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 92 days.

(21) Appl. No.: 15/742,188

(22) PCT Filed: Oct. 24, 2017

(86) PCT No.: PCT/CN2017/107452
§ 371 (c)(1),
(2) Date: Jan. 5, 2018

(87) PCT Pub. No.: WO2019/056463
PCT Pub. Date: Mar. 28, 2019

(65) Prior Publication Data
US 2019/0097145 A1 Mar. 28, 2019

(30) Foreign Application Priority Data
Sep. 25, 2017 (CN) .......................... 2017 1 0876584

(51) Int. Cl.
H01L 51/00 (2006.01)
H01L 51/56 (2006.01)
(Continued)

(52) U.S. Cl.
CPC .......... *H01L 51/0096* (2013.01); *B32B 17/06* (2013.01); *H01L 51/5246* (2013.01); *H01L 51/56* (2013.01); *H01L 2251/303* (2013.01)

(58) Field of Classification Search
CPC . H01L 51/0096; H01L 51/5246; H01L 51/56; H01L 2251/303; H01L 2251/105;
(Continued)

(56) References Cited

U.S. PATENT DOCUMENTS

2016/0172626 A1* 6/2016 Suzuka ............... H01L 51/5259
257/40
2018/0331320 A1* 11/2018 Su ....................... H01L 51/5246

FOREIGN PATENT DOCUMENTS

CN 101866584 A 10/2010
CN 106450038 A 2/2017
(Continued)

*Primary Examiner* — Catherine A. Simone
(74) *Attorney, Agent, or Firm* — Hemisphere Law, PLLC; Zhigang Ma

(57) ABSTRACT

A glass substrate is provided. The glass substrate comprises the following elements. A main body includes at least one array of bumps disposed thereon and a gel layer covering the at least one array of bumps. The at least one array of bumps includes multiple bumps made of an insulating material, and between adjacent bumps a predetermined spacing is reserved. An OLED device and a method of fabricating the glass substrate are also provided. Thus, the poor effect in current design of extending the moisture infiltration path is improved, the adherence between the gel layer and the glass substrate is increased, and thereby to protect the devices and extend the lifetime of the devices.

10 Claims, 2 Drawing Sheets

(51) Int. Cl.
*H01L 51/52* (2006.01)
*B32B 17/06* (2006.01)

(58) Field of Classification Search
CPC . H01L 2251/301; H01L 2251/50; B32B 3/10; B32B 17/00; B32B 17/06; B32B 17/08; B32B 2457/206; B32B 2457/20
See application file for complete search history.

(56) References Cited

FOREIGN PATENT DOCUMENTS

| | | | | |
|---|---|---|---|---|
| CN | 206098458 U | 4/2017 | | |
| CN | 106784351 A | 5/2017 | | |
| CN | 106876328 A | * | 6/2017 | ......... H01L 51/5246 |

* cited by examiner

US 10,608,191 B2

OLED DEVICE, GLASS SUBSTRATE AND FABRICATING METHOD THEREOF

RELATED APPLICATIONS

The present application is a National Phase of International Application Number PCT/CN2017/107452, filed Oct. 24, 2017, and claims the priority of China Application No. 201710876584.2, filed Sep. 25, 2017.

FIELD OF THE DISCLOSURE

The disclosure relates to the technical field of semiconductor, and more particularly to an OLED device, a glass substrate and the fabricating method thereof.

BACKGROUND

Comparing with the liquid crystal displays (LCD), the organic light emitting displays (OLED) as a new generation of displays have the advantages of spontaneous luminescence, fast response, wide viewing angles, better color saturation, etc. The package of the OLED is to form an organic film on the substrate including OLED devices thereon. The organic film is filled between the anode and cathode made of metal or conducting materials. When two electrodes are applied with electrical power, the organic film would emit light. However, the moisture in air would cause the reactive metal of cathode be oxidized and have chemical reaction with the organic material, thereby to fail the OLED devices. Therefore, how to encapsulate the OLED devices effectively for keeping the OLED devices apart from moisture is very important for extending the lifetime of the OLED devices.

Because improving encapsulating effect becomes the key point of the packaging technology, producers and researchers pay more attention to packaging technology to improve the encapsulating effect for extending the lifetime of devices. In the packaging technology of OLED devices, the dam material is used to form an enclosed space for preventing the outside moisture or oxygen from invading the devices to react with the organic material, thereby to obtain the function of protecting the devices and extending the lifetime of the devices.

Applicants found the current methods of extending the lifetime of OLED devices are mainly fulfilled by promoting the blocking effect of the material, however, the effect of extending the moisture infiltration path is not good.

SUMMARY

For solving the technical issues, the present invention provides a glass substrate, an OLED device and a method of fabricating the glass substrate, for improving the poor effect of extending the moisture infiltration path in current design, and for increasing the adherence between the dam material and the glass substrate to promote the encapsulating effect, and thereby to protect the devices and extend the lifetime of the devices.

For solving the technical issues, the present invention provides a glass substrate, comprising the following elements. A main body includes at least one array of bumps disposed thereon and a gel layer covering the at least one array of bumps. The at least one array of bumps includes multiple bumps made of an insulating material, and between adjacent bumps a predetermined spacing is reserved.

In one embodiment, each one of the at least one array of bumps includes first bumps and second bumps, the first bumps and the second bumps are arranged alternately.

Each the first bump is a trapezoidal column with one end facing the main body and another end far away the main body, and a surface area of the one end of the first bump is larger than a surface area of the another end of the first bump.

Each the second bump is a trapezoidal column with one end facing the main body and another end far away the main body, and a surface area of the one end of the second bump is smaller than a surface area of the another end of the second bump.

In one embodiment, each the first bump has a same height, each the second bump has a same height, and the height of the each first bump is larger than the height of the each second bump.

In one embodiment, the each first bump and the each second bump are made of at least one of organic material and/or inorganic material; wherein the organic material includes of SiOx, SiNx and $Al_2O_3$; and the inorganic material includes of ZnO and $TiO_2$.

In one embodiment, the gel layer covering the each array of bumps has a same thickness.

In one embodiment, the gel layer is made of a dam material.

Correspondingly, the present invention also provides an OLED device. The OLED device comprises a glass substrate. The glass substrate comprises a main body including at least one array of bumps disposed thereon and a gel layer covering the at least one array of bumps.

The at least one array of bumps includes multiple bumps made of an insulating material, and between adjacent bumps is reserved a predetermined spacing.

In one embodiment, each one of the at least one array of bumps includes first bumps and second bumps, the first bumps and the second bumps are arranged alternately.

In one embodiment, each the first bump is a trapezoidal column with one end facing the main body and another end far away the main body, and a surface area of the one end of the first bump is larger than a surface area of the another end of the first bump.

Each the second bump is a trapezoidal column with one end facing the main body and another end far away the main body, and a surface area of the one end of the second bump is smaller than a surface area of the another end of the second bump.

In one embodiment, each the first bump has a same height, each the second bump has a same height, and the height of the each first bump is larger than the height of the each second bump.

In one embodiment, the each first bump and the each second bump are made of at least one of organic material and/or inorganic material; wherein the organic material includes of SiOx, SiNx and $Al_2O_3$; and the inorganic material includes of ZnO and $TiO_2$.

In one embodiment, the gel layer covering the each array of bumps has a same thickness.

In one embodiment, the gel layer is made of dam material.

Correspondingly, the present invention also provides a method of fabricating a glass substrate OLED device. The method comprises the following steps of providing a glass substrate and coating an insulating layer on the glass substrate; etching the insulating layer to form at least one array of bumps, wherein each the array of bumps includes multiple bumps, and between adjacent bumps is reserved a predetermined spacing; cleaning the each array of bumps;

and coating a gel layer to cover each the array of bumps after the step of cleaning the each array of bumps.

In one embodiment, the step of etching the insulating layer is performed by a laser engraving procedure or a lithography etching procedure.

In one embodiment, the insulating layer is made of at least one of organic material and/or inorganic material; wherein the organic material includes of SiOx, SiNx and $Al_2O_3$; and the inorganic material includes of ZnO and $TiO_2$.

Comparing to the glass substrate in prior art, the array of bumps is disposed between the glass substrate and the gel layer in the present invention. The array of bumps includes multiple bumps arranged with a predetermined spacing between the adjacent bumps, for increasing the gluing length of the gel layer. Thus, the poor effect in current design of extending the moisture infiltration path is improved, the adherence between the gel layer and the glass substrate is increased, and thereby to protect the devices and extend the lifetime of the devices.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

The disclosure will be further described in detail with reference to accompanying drawings and preferred embodiments as follows.

Figure 1:
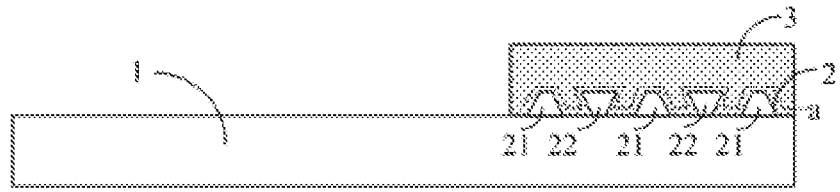
FIG. 1 is a cross-sectional view of a portion of the glass substrate in the first embodiment of the present invention.

Referring to FIG. 1, a glass substrate provided by the present invention comprising a main body 1. The main body 1 includes at least one array of bumps 2 disposed thereon and a gel layer 3 covering the at least one array of bumps 2.

Each array of bumps 2 includes multiple bumps made of an insulating material, and between adjacent bumps is reserved a predetermined spacing.

It is understandable, the multiple bumps are arranged with a predetermined spacing between adjacent bumps, so the gluing length of the gel layer 3 is extended along outer surfaces of the bumps, as the curve a shown in FIG. 1, thereby to increase the gluing length of the gel layer and to extend the moisture infiltration path. Thus, the poor effect in current design of extending the moisture infiltration path is improved, the adherence between the gel layer and the glass substrate is increased, and thereby to protect the devices and extend the lifetime of the devices. Besides, each array of the bumps is made of the insulating material to prevent the oxidation due to invading moisture from decreasing the life time of the OLED devices attached on the glass substrate.

For further extending the moisture infiltration path, each array of bumps 2 includes first bumps 21 and second bumps 22. The first bumps 21 and the second bumps 22 are arranged alternately.

Each the first bump 21 is a trapezoidal column with one end facing the main body 1 and another end far away the main body 1. A surface area of the one end of the first bump 21 is larger than a surface area of the another end of the first bump 21.

Each the second bump 22 is a trapezoidal column with one end facing the main body 1 and another end far away the main body 1. A surface area of the one end of the second bump 22 is smaller than a surface area of the another end of the second bump 22.

It is understandable, the length of a leg of a trapezoid is larger than the vertical height of the trapezoid. Therefore, it is better to form the first bump 21 and the second bump 22 as trapezoidal columns, rather than straight columns, for further extending the moisture infiltration path.

Surely, the moisture infiltration path can also be adjusted by changing the heights of the first bumps 21 and the second bumps 22. In one embodiment, each the first bump 21 has a same height, and each the second bump 22 also has a same height, and the height of the each first bump 21 is larger than the height of the each second bump 22. In another embodiment, each the first bump 21 has a same height, and each the second bump 22 also has a same height, and the height of the each first bump 21 is smaller than the height of the each second bump 22. Certainly, the above embodiments are not limited to the recitation herein.

In one embodiment, the insulating material applied to form the array of bumps 2 could be at least one of the organic material and the inorganic material. Therefore, the each first bump 21 and the each second bump 22 are made of at least one of the organic material and the inorganic material. Namely, the material applied to form the first bump 21 and the second bump 22 can be chosen from a group of the organic material and/or the inorganic material; wherein the organic material includes of SiOx, SiNx and $Al_2O_3$; and the inorganic material includes of ZnO and $TiO_2$.

For the convenience of packaging the OLED devices, the gel layer 3 covering the each array of bumps 2 has a same thickness. In one embodiment, the gel layer is made of a dam material or other enclosure materials.

Corresponding to the glass substrate illustrated in the first embodiment, an OLED device is provided in a second embodiment of the present invention. The OLED device comprises a glass substrate. The glass substrate of the second embodiment has the same structures and same connections as the glass substrate illustrated in first embodiment, so no more repeat herein.

Figure 2:
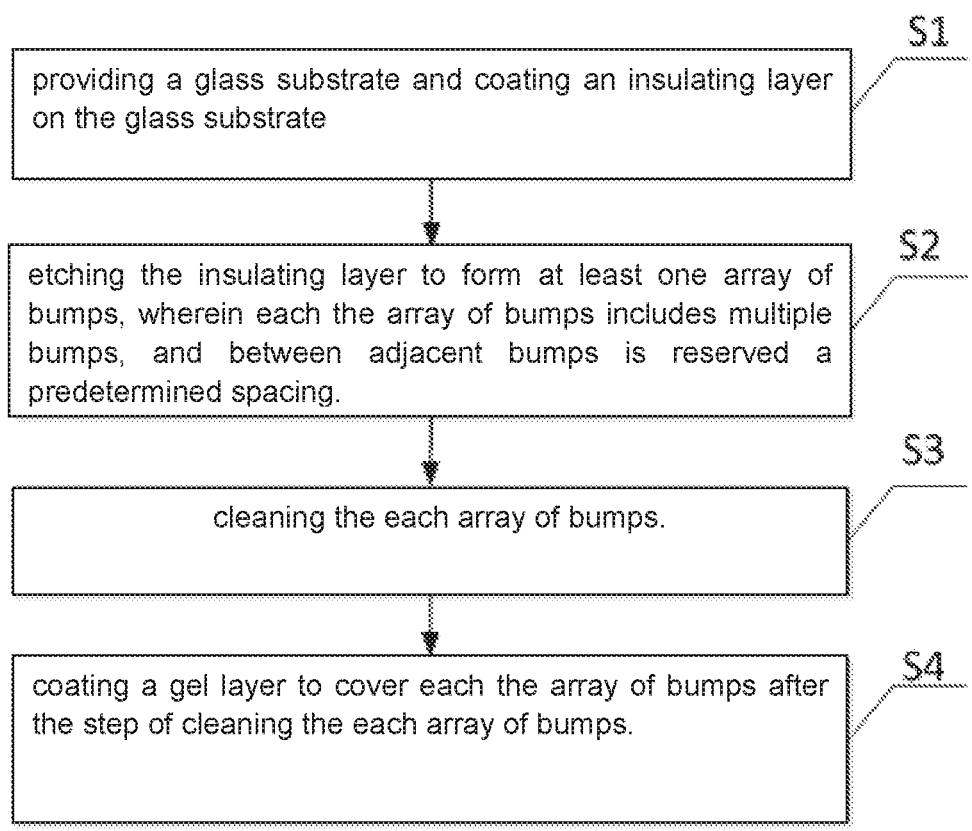
FIG. 2 is a flowing chart illustrating the steps of fabricating the glass substrate in the third embodiment of the present invention.

Referring to FIG. 2, corresponding to the glass substrate illustrated in the first embodiment, the present invention also provides a method of fabricating a glass substrate. The method comprises the following steps.

The step 1 is providing a glass substrate and coating an insulating layer on the glass substrate.

The step 2 is etching the insulating layer to form at least one array of bumps, wherein each the array of bumps includes multiple bumps, and between adjacent bumps is reserved a predetermined spacing.

The step 3 is cleaning the each array of bumps.

The step 4 is coating a gel layer to cover each the array of bumps after the step of cleaning the each array of bumps.

In one embodiment, the step of etching the insulating layer is performed by a laser engraving procedure or a lithography etching procedure.

In one embodiment, the insulating layer is made of at least one of the organic material and/or the inorganic material; wherein the organic material includes of SiOx, SiNx and $Al_2O_3$; and the inorganic material includes of ZnO and $TiO_2$.

In one embodiment, each one of the at least one array of bumps includes first bumps and second bumps, the first bumps and the second bumps are arranged alternately.

In one embodiment, each the first bump is a trapezoidal column with one end facing the main body and another end far away the main body, and a surface area of the one end of the first bump is larger than a surface area of the another end of the first bump.

Each the second bump is a trapezoidal column with one end facing the main body and another end far away the main body, and a surface area of the one end of the second bump is smaller than a surface area of the another end of the second bump.

In one embodiment, each the first bump has a same height, each the second bump has a same height, and the height of the each first bump is larger than the height of the each second bump.

Figure 3A:
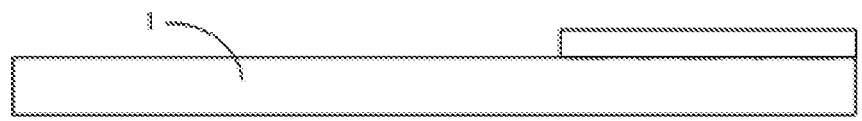
FIG. 3 is a serial of the cross-sectional views of the glass substrate illustrating the steps of fabricating the glass substrate in second embodiment of the present invention.
Figure 3B:
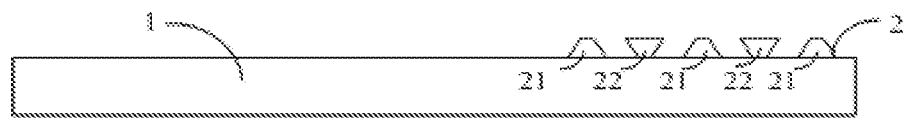
Figure 3C:
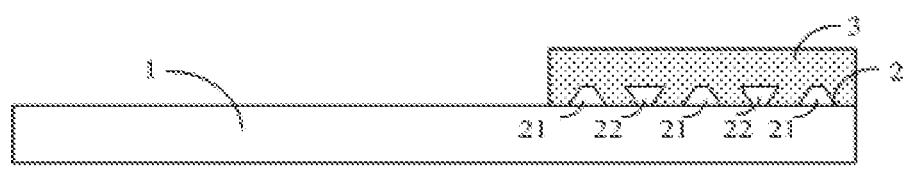

Referring to FIGS. 3a to 3b, these cross-sectional views of the glass substrate illustrate the method for fabricating the glass substrate of a third embodiment. FIG. 3a shows the result of the above step 1. FIG. 3b shows the result of the above step 2. FIG. 3c shows the result of the above step 4.

The above embodiments of the present invention have at east following advantages.

Comparing to the glass substrate in prior art, the array of bumps is disposed between the glass substrate and the gel layer in the present invention. The array of bumps includes multiple bumps arranged with a predetermined spacing between the adjacent bumps, for increasing the gluing length of the gel layer. Thus, the poor effect in current design of extending the moisture infiltration path is improved, the adherence between the gel layer and the glass substrate is increased, and thereby to protect the devices and extend the lifetime of the devices.

The foregoing contents are detailed description of the disclosure in conjunction with specific preferred embodiments and concrete embodiments of the disclosure are not limited to these descriptions. For the person skilled in the art of the disclosure, without departing from the concept of the disclosure, simple deductions or substitutions can be made and should be included in the protection scope of the application.

What is claimed is:

1. A glass substrate, comprising: a main body including at least one array of bumps disposed thereon and a gel layer covering the at least one array of bumps, wherein the at least one array of bumps includes multiple bumps made of an insulating material, and between adjacent bumps is reserved a predetermined spacing;

wherein each one of the at least one array of bumps includes first bumps and second bumps, the first bumps and the second bumps are arranged alternately, each the first bump is a trapezoidal column with one end facing the main body and another end far away from the main body, and a surface area of the one end of the first bump is larger than a surface area of the another end of the first bump, each the second bump is a trapezoidal column with one end facing the main body and another end far away from the main body, and a surface area of the one end of the second bump is smaller than a surface area of the another end of the second bump.

2. The glass substrate according to claim 1, wherein each the first bump has a same height, each the second bump has a same height, and the height of the each first bump is larger than the height of the each second bump.

3. The glass substrate according to claim 2, wherein the each first bump and the each second bump are made of at least one of organic material and/or inorganic material; wherein the organic material includes one of SiOx, SiNx and $Al_2O_3$; and the inorganic material includes one of ZnO and $TiO_2$.

4. The glass substrate according to claim 3, wherein the gel layer covering the each array of bumps has a same thickness.

5. The glass substrate according to claim 4, wherein the gel layer is made of dam material.

6. An OLED device, comprising a glass substrate, wherein the glass substrate comprises a main body including at least one array of bumps disposed thereon and a gel layer covering the at least one array of bumps, wherein the at least one array of bumps includes multiple bumps made of an insulating material, and between adjacent bumps is reserved a predetermined spacing;

wherein each one of the at least one array of bumps includes first bumps and second bumps, the first bumps and the second bumps are arranged alternately, each the first bump is a trapezoidal column with one end facing the main body and another end far away from the main body, and a surface area of the one end of the first bump is larger than a surface area of the another end of the first bump, each the second bump is a trapezoidal column with one end facing the main body and another end far away from the main body, and a surface area of the one end of the second bump is smaller than a surface area of the another end of the second bump.

7. The OLED device according to claim 6, wherein each the first bump has a same height, each the second bump has a same height, and the height of the each first bump is larger than the height of the each second bump.

8. The OLED device according to claim 7, wherein the each first bump and the each second bump are made of at least one of organic material and/or inorganic material; wherein the organic material includes one of SiOx, SiNx and $Al_2O_3$; and the inorganic material includes one of ZnO and $TiO_2$.

9. The OLED device according to claim 8, wherein the gel layer covering the each array of bumps has a same thickness.

10. The OLED device according to claim 9, wherein the gel layer is made of dam material.

* * * * *